(12) United States Patent
Hamada et al.

(10) Patent No.: US 11,136,484 B2
(45) Date of Patent: Oct. 5, 2021

(54) THERMALLY CONDUCTIVE SHEET

(71) Applicant: SEKISUI CHEMICAL CO., LTD., Osaka (JP)

(72) Inventors: Masahiro Hamada, Shiraoka (JP); Daisuke Mukohata, Saitama (JP); Koji Shimonishi, Walled Lake, MI (US); Yuuki Hoshiyama, Shiraoka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 310 days.

(21) Appl. No.: 16/341,976

(22) PCT Filed: Nov. 30, 2017

(86) PCT No.: PCT/JP2017/043186
§ 371 (c)(1),
(2) Date: Apr. 15, 2019

(87) PCT Pub. No.: WO2018/101445
PCT Pub. Date: Jun. 7, 2018

(65) Prior Publication Data
US 2019/0241786 A1   Aug. 8, 2019

(30) Foreign Application Priority Data
Nov. 30, 2016 (JP) .............................. JP2016-233140

(51) Int. Cl.
| | |
|---|---|
| *C09K 5/14* | (2006.01) |
| *C08K 3/04* | (2006.01) |
| *C08J 5/18* | (2006.01) |
| *H01L 23/373* | (2006.01) |
| *B32B 25/02* | (2006.01) |
| *B32B 25/04* | (2006.01) |
| *B32B 25/16* | (2006.01) |
| *B32B 25/20* | (2006.01) |
| *C08K 3/38* | (2006.01) |
| *C08K 3/34* | (2006.01) |
| *H05K 7/20* | (2006.01) |
| *C08K 3/28* | (2006.01) |
| *C08K 3/22* | (2006.01) |

(Continued)

(52) U.S. Cl.
CPC .................. *C09K 5/14* (2013.01); *B32B 7/02* (2013.01); *B32B 25/02* (2013.01); *B32B 25/042* (2013.01); *B32B 25/16* (2013.01); *B32B 25/20* (2013.01); *B32B 27/18* (2013.01); *C08J 5/18* (2013.01); *C08K 3/04* (2013.01); *C08K 3/042* (2017.05); *C08K 3/22* (2013.01); *C08K 3/28* (2013.01); *C08K 3/34* (2013.01); *C08K 3/38* (2013.01); *C08L 101/00* (2013.01); *H01L 23/3735* (2013.01); *H01L 23/3737* (2013.01); *H05K 7/20* (2013.01); *B32B 2250/248* (2013.01); *B32B 2262/105* (2013.01); *B32B 2262/106* (2013.01); *B32B 2307/302* (2013.01); *B32B 2457/14* (2013.01); *C08J 2309/00* (2013.01); *C08J 2309/02* (2013.01); *C08J 2323/16* (2013.01); *C08J 2383/04* (2013.01); *C08K 2003/385* (2013.01); *C08K 2201/001* (2013.01); *C08K 2201/005* (2013.01); *H01L 23/373* (2013.01); *H01L 23/3731* (2013.01); *H01L 23/42* (2013.01)

(58) Field of Classification Search
CPC . C09K 5/14; C08J 5/18; C08J 2309/02; C08J 2309/00; C08J 2383/04; C08J 2323/16; H01L 23/3737; H01L 23/3735; B32B 2457/14; B32B 25/02; B32B 25/042; B32B 25/16; B32B 25/20; B32B 2262/106; B32B 2250/248; B32B 2262/105; B32B 2307/302; C08K 3/38; C08K 3/042; C08K 2003/385; C08K 2201/001; C08K 2201/005
USPC ........................................................ 428/521
See application file for complete search history.

(56) References Cited

U.S. PATENT DOCUMENTS

| | | | | |
|---|---|---|---|---|
| 6,306,957 | B1 * | 10/2001 | Nakano ................... | C08L 83/04 524/700 |
| 2003/0170446 | A1 * | 9/2003 | Takahashi ................ | C08K 3/22 428/323 |

(Continued)

FOREIGN PATENT DOCUMENTS

| | | |
|---|---|---|
| CN | 103827221 | 5/2014 |
| JP | 11-26661 | 1/1999 |

(Continued)

OTHER PUBLICATIONS

Extended European Search Report dated Jun. 9, 2020 in corresponding European Patent Application No. 17876675.4.

(Continued)

*Primary Examiner* — Hui H Chin
(74) *Attorney, Agent, or Firm* — Wenderoth, Lind & Ponack, L.L.P.

(57) ABSTRACT

A heat-conducting sheet according to the present invention is a heat-conducting sheet having an initial Asker C hardness of 50 or less, the heat-conducting sheet containing an elastomer resin at the volume proportion of 30 to 70%, and a thermally conductive filler at the volume proportion of 30 to 70%, in which the elastomer resin has a viscosity at 25° C. of 3000 Pa·s or less, and the elastomer resin has a lamella length of 20 mm or more. According to the present invention, a heat-conducting sheet which has initial flexibility sufficient to exhibit excellent shape conformability and in which residual stress is reduced after compression by applying pressure can be provided.

8 Claims, 1 Drawing Sheet

(51) Int. Cl.
    *B32B 27/18*     (2006.01)
    *C08L 101/00*     (2006.01)
    *B32B 7/02*     (2019.01)
    *H01L 23/42*     (2006.01)

(56) References Cited

U.S. PATENT DOCUMENTS

| | | |
|---|---|---|
| 2014/0248504 A1 | 9/2014 | Song et al. |
| 2015/0122422 A1 | 5/2015 | Hayasaka et al. |
| 2015/0316332 A1* | 11/2015 | Kato ............... B32B 15/20 |
| | | 165/185 |
| 2018/0112115 A1 | 4/2018 | Hamada |
| 2018/0194122 A1* | 7/2018 | Kumamoto ......... H01L 23/3737 |

FOREIGN PATENT DOCUMENTS

| | | |
|---|---|---|
| JP | 2003-200437 | 7/2003 |
| JP | 2014-209537 | 11/2014 |
| WO | 2014/083890 | 6/2014 |
| WO | 2016/129257 | 8/2016 |
| WO | 2016/152660 | 9/2016 |

OTHER PUBLICATIONS

International Search Report dated Feb. 27, 2018 in International Application No. PCT/JP2017/043186, with English translation.
Office Action dated Jul. 5, 2021 in Chinese Patent Application No. 201780063318.6, with English-language translation.

* cited by examiner

THERMALLY CONDUCTIVE SHEET

TECHNICAL FIELD

The present invention relates to a heat-conducting sheet.

BACKGROUND ART

A heat-conducting sheet is mainly disposed between a heating element such as a semiconductor package and a heat sink such as aluminum or copper and has a function of promptly transferring heat generated at the heating element to the heat sink thereby. In recent years, a calorific value per unit area of a semiconductor package has become large due to enhancements in integration of semiconductor devices and in density of wiring in semiconductor packages, and as a result, a demand for a heat-conducting sheet in which the thermal conductivity is more improved to enable facilitation of prompter heat dissipation than conventional heat-conducting sheets has been increasing.

In addition, a heat-conducting sheet having a good shape conformability (flexible heat-conducting sheet) is desired in order to allow the heat-conducting sheet to adhere to heating element such as semiconductor packages having variety of shapes.

Patent Literature 1 discloses a technique on a heat-conducting sheet obtained by heating/curing a mixture containing: boron nitride which is a thermally conductive filler; and addition reaction curable type liquid silicone.

CITATION LIST

Patent Literature

PTL1: JP 11-26661 A

SUMMARY OF INVENTION

Technical Problem

The heat-conducting sheet described in Patent Literature 1 has an Asker C hardness of 45 or less and thereby has a good flexibility, but the residual stress is not reduced after the heat-conducting sheet is introduced between a heating element and a heat sink by compression, and therefore there is a tendency that the restoring force is strong.

Generally, if the heat-conducting sheet has a strong restoring force when disposed between a heating element such as a semiconductor package and a heat sink, in a case where a heat-conducting sheet is used to a heating element such as an electronic component which is vulnerable to pressure, there is a risk that the heat-conducting sheet causes damage to the heating element.

That is, when a heat-conducting sheet is introduced between a heating element and a heat sink, a heat-conducting sheet which has flexibility sufficient to exhibit good shape conformability and in which the residual stress is reduced after a lapse of a certain time in order to prevent damage of a heating element such as an electronic device is required.

The present invention has been conceived in consideration of the conventional problem, and an object of the present invention is to provide a heat-conducting sheet which has initial flexibility sufficient to exhibit excellent shape conformability and in which the residual stress is reduced after compression by applying pressure.

Solution to Problem

The present inventors have conducted diligent studies in order to achieve the object to find that a heat-conducting sheet comprising an elastomer resin and a thermally conductive filler, the heat-conducting sheet obtained by adjusting the volume proportion of the elastomer resin and of the thermally conductive filler, and controlling the viscosity and the lamella length of the elastomer resin solves the problem, thereby completing the present invention.

That is, the present invention relates to the following [1] to [9].

[1] A heat-conducting sheet comprising: an elastomer resin at the volume proportion of 30 to 70%; and a thermally conductive filler at the volume proportion of 30 to 70%, the elastomer resin having a viscosity at 25° C. of 3000 Pa·s or less; the elastomer resin having a lamella length of 20 mm or more, and the heat-conducting sheet having an initial Asker C hardness of 50 or less.

[2] The heat-conducting sheet according to [1], having a thermal conductivity of 5 W/m·K or more.

[3] The heat-conducting sheet according to [1] or [2], wherein the Asker C hardness after a lapse of 30 seconds from the start of measurement is half of the initial Asker C hardness or less.

[4] The heat-conducting sheet according to any one of [1] to [3], having a 25% compressive strength of 200 kPa or less.

[5] The heat-conducting sheet according to any one of [1] to [4], having a 50% compressive strength of 1000 kPa or less.

[6] The heat-conducting sheet according to any one of [1] to [5], having a gel fraction of 20% or less.

[7] The heat-conducting sheet according to any one of [1] to [6], wherein the thermally conductive filler is at least one selected from the group consisting of aluminum oxide, magnesium oxide, boron nitride, talc, aluminum nitride, graphene, a boron nitride nanotube, a carbon nanotube, and diamond.

[8] The heat-conducting sheet according to any one of [1] to [7], wherein the thermally conductive filler has an average particle size of 200 μm or less and a thermal conductivity of 8 W/m·K or more.

[9] The heat-conducting sheet according to any one of [1] to [8], being a laminated body obtained by laminating resin layers each comprising the elastomer resin and the thermally conductive filler in a plane direction, wherein a thickness of one layer of the laminated resin layers is 1000 μm or less.

Advantageous Effects of Invention

According to the present invention, a heat-conducting sheet which has initial flexibility sufficient to exhibit excellent shape conformability and in which residual stress is reduced after compression by applying pressure can be provided.

DESCRIPTION OF EMBODIMENTS

[Heat-Conducting Sheet]

Figure 1:
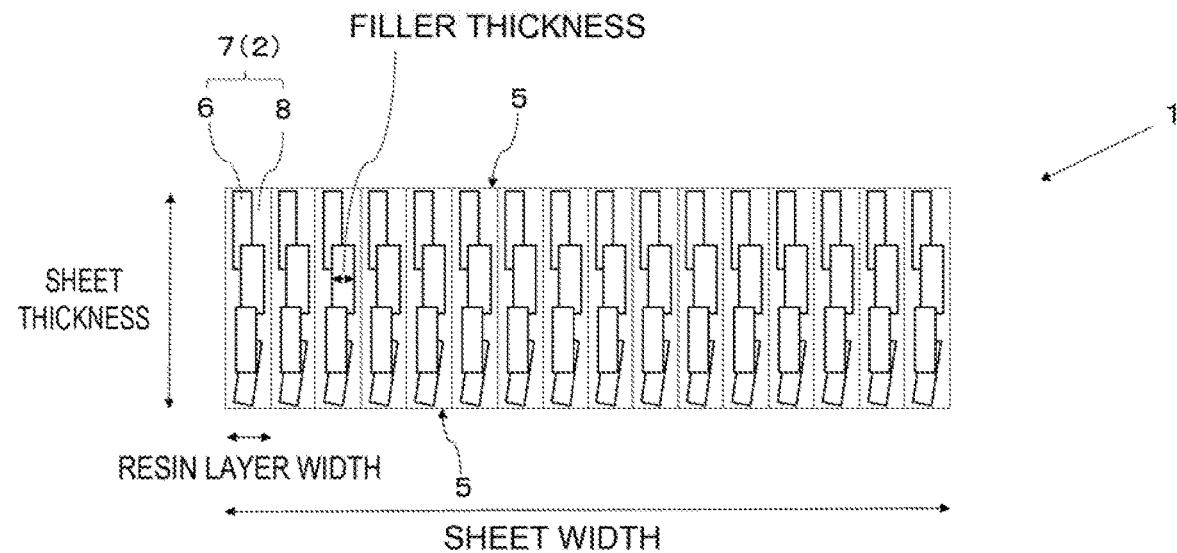
FIG. 1 is a schematic sectional view of a heat-conducting sheet composed of a laminated body.

A heat-conducting sheet according to the present invention is a heat-conducting sheet having an initial Asker C hardness of 50 or less, the heat-conducting sheet comprising: an elastomer resin at the volume proportion of 30 to 70%; and a thermally conductive filler at the volume proportion of 30 to 70%, wherein: the elastomer resin has a viscosity at 25° C. of 3000 Pa·s or less; and the elastomer resin has a lamella length of 20 mm or more.

(Elastomer Resin)

The volume proportion of the elastomer resin being comprised in the heat-conducting sheet according to the present invention in the whole heat-conducting sheet is 30 to 70%. When the volume proportion is less than 30%, the flexibility of the heat-conducting sheet becomes insufficient, and when the volume proportion exceeds 70%, the thermal conductivity is degraded.

The volume proportion of the elastomer resin in the whole heat-conducting sheet is preferably 35 to 65%, more preferably 40 to 60%, and further more preferably 45 to 55%. The volume proportion of the elastomer resin can be calculated from the mass because the specific gravity has been known.

The viscosity of the elastomer resin at 25° C. is to be 3000 Pa·s or less. When the viscosity exceeds 3000 Pa·s, the flexibility of the heat-conducting sheet becomes insufficient. From the viewpoint of further improving the flexibility of the heat-conducting sheet, the viscosity of the elastomer resin at 25° C. is preferably 2000 Pa·s or less, more preferably 1000 Pa·s or less, further more preferably 500 Pa·s or less, and even more preferably 200 Pa·s or less. From the viewpoint of moldability, the viscosity of the elastomer resin at 25° C. is preferably 1 Pa·s or more, and more preferably 10 Pa·s or more.

It is to be noted that the viscosity of the elastomer resin can be measured by the method described in Examples.

In the present invention, the lamella length of the elastomer resin is specified. The lamella length is measured by the method described in Examples for further details, and is a value obtained in such a way that a ring is sunk in a liquid composed of the elastomer resin, and when the ring is lifted at a constant speed, length reached till a liquid film formed in the ring is cut is measured, the value being an index indicating elongation of the liquid film. Therefore, the lamella length is an index of elongation of the heat-conducting sheet comprising the elastomer resin.

The lamella length of the elastomer resin according to the present invention is 20 mm or more. In the case when the lamella length is less than 20 mm, the flexibility of the heat-conducting sheet deteriorates, and the residual stress after applying pressure becomes hard to reduce. Though it is generally considered that when the viscosity of an elastomer resin becomes lower to make the lamella length smaller, the flexibility of a sheet comprising the elastomer resin becomes better, in the case of a heat-conducting sheet such as the one according to the present invention comprising a certain amount of a thermally conductive filler in addition to an elastomer resin, when the lamella length is too small, the flexibility deteriorates on the contrary. It is inferred that this is because when an elastomer resin having a small lamella length is used, the thermally conductive fillers can easily collide with each another, and this lowers the fluidity to cause the flexibility to deteriorate. In addition, it is considered that when the fluidity is lowered, the residual stress after applying pressure becomes unlikely to be reduced. In this way, in the case of the heat-conducting sheet comprising an elastomer resin and a thermally conductive filler, it is important in controlling the flexibility of the sheet to control the lamella length in addition to the viscosity of the elastomer resin.

The lamella length is preferably 25 mm or more, more preferably 30 mm or more, and preferably 140 mm or less, more preferably 100 mm or less, and even more preferably 65 mm or less. When the lamella length is in such a range, the flexibility of the heat-conducting sheet is further improved.

The lamella length of the elastomer resin is generally correlated with the viscosity of the elastomer resin as described above. Therefore, the lamella length can be adjusted by the molecular weight of the elastomer resin, the types of monomers which are constituent units, and, in the case of a copolymer, the composition ratio of comonomers, and the like.

The glass transition temperature of the elastomer resin is preferably room temperature or less (for example, 25° C. or less). The heat-conducting sheet using such an elastomer resin is excellent in flexibility.

Examples of the type of the elastomer resin include acrylonitrile butadiene rubber, liquid acrylonitrile butadiene rubber, ethylene-propylene-diene rubber, liquid ethylene-propylene-diene rubber, ethylene-propylene rubber, liquid ethylene-propylene rubber, natural rubber, liquid natural rubber, polybutadiene rubber, liquid polybutadiene rubber, polyisoprene rubber, liquid polyisoprene rubber, a styrene-butadiene block copolymer, a liquid styrene-butadiene block copolymer, a hydrogenated styrene-butadiene block copolymer, a liquid hydrogenated styrene-butadiene block copolymer, a hydrogenated styrene-butadiene-styrene block copolymer, a liquid hydrogenated styrene-butadiene-styrene block copolymer, a hydrogenated styrene-isoprene block copolymer, a liquid hydrogenated styrene-isoprene block copolymer, a hydrogenated styrene-isoprene-styrene block copolymer, a liquid hydrogenated styrene-isoprene-styrene block copolymer, silicone, liquid silicone, acrylic rubber, and liquid acrylic rubber (it is to be noted that acrylic rubber means polymerized product of monomers containing acrylic acid ester and/or methacrylic acid ester). Among these, liquid elastomer resins are preferable, and liquid acrylonitrile butadiene rubber, liquid ethylene-propylene-diene rubber, liquid polyisoprene rubber, and liquid silicone are preferable. In addition, the elastomers which are not liquid are preferably used by being kneaded with the liquid resins of the same groups in order to obtain flexibility.

(Thermally Conductive Filler)

The volume proportion of the thermally conductive filler composing the heat-conducting sheet according to the present invention in the whole heat-conducting sheet is 30 to 70%. When the volume proportion is less than 30%, the heat-conducting properties of the heat-conducting sheet become insufficient, and when the volume proportion exceeds 70%, the flexibility deteriorates.

The volume proportion of the thermally conductive filler in the whole heat-conducting sheet is preferably 35 to 65%, more preferably 40 to 60%, and even more preferably 45 to 55%. The volume proportion of the thermally conductive filler can be calculated from the mass because the specific gravity has been known.

From the viewpoint of improving the heat-conducting properties, the thermal conductivity of the thermally conductive filler is preferably 8 W/m·K or more, and more preferably 20 W/m·K or more.

The shape of the thermally conductive filler is not particularly limited, and, for example, a spherical filler, a crushed filler, a plate-like filler, and the like can be used, but among these, a plate-like filler is preferably used from the viewpoint of improving the heat-conductivity of the heat-conducting sheet. In the case of a plate-like filler, when a face having the maximum area is denoted as an XY plane among respective faces constituting the surfaces, and the minimum size of the sides constituting the XY or YZ plane is defined as thickness, the plate-like filler preferably has a shape satisfying the size in the longitudinal direction of the XY plane/thickness >2.0.

From the viewpoint of improving the thermal conductivity, the thickness of the plate-like filler is preferably 0.05 to 500 μm, and more preferably 0.25 to 250 μm.

The average particle size of the thermally conductive filler measured by a light scattering method is preferably 0.1 μm or more, more preferably 0.5 μm or more, and even more preferably 1 μm or more, and preferably 200 μm or less, more preferably 150 μm or less, and even more preferably 100 μm or less. It is to be noted that the particle size in the plate-like filler is the size of the XY plane in the longitudinal direction.

Examples of the material for the thermally conductive filler include carbides, nitrides, oxides, hydroxides, metals, and carbon-based materials.

Examples of the carbides include silicon carbide, boron carbide, aluminum carbide, titanium carbide, and tungsten carbide.

Examples of the nitrides include silicon nitride, boron nitride, a boron nitride nanotube, aluminum nitride, gallium nitride, chromium nitride, tungsten nitride, magnesium nitride, molybdenum nitride, and lithium nitride.

Examples of the oxides include iron oxide, silicon oxide (silica), aluminum oxide (alumina) (including hydrates of aluminum oxide (such as boehmite)), magnesium oxide, titanium oxide, cerium oxide, and zirconium oxide. In addition, examples of the oxides include: a transition metal oxide such as barium titanate; and further, indium tin oxide and antimony tin oxide in which a metal ion is doped.

Examples of the hydroxides include aluminum hydroxide, calcium hydroxide, and magnesium hydroxide.

Examples of the metals include copper, gold, nickel, tin, iron, or alloys thereof.

Examples of the carbon-based materials include carbon black, graphite, diamond, graphene, fullerene, a carbon nanotube, a carbon nanofiber, a nano-horn, a carbon microcoil, and a nano-coil.

The thermally conductive filler other than those described above include talc which is a silicate mineral.

These thermally conductive fillers can be used singly, or two types or more of these can be used together. From the viewpoint of the heat-conductivity, the thermally conductive filler is preferably at least any one of aluminum oxide, magnesium oxide, boron nitride, talc, aluminum nitride, graphene, a boron nitride nanotube, a carbon nanotube, and diamond. The thermally conductive filler is more preferably at least any one of boron nitride and graphene. Boron nitride is more preferably used in applications where electric insulation is further required.

(Other Additives)

If necessary, an additive that is generally used for a heat-conducting sheet, such as an antioxidant, a heat stabilizer, a colorant, a flame retardant, an anti-static agent, a filler other than the thermally conductive filler, and a decomposition temperature adjusting agent may be formulated in the heat-conducting sheet according to the present invention.

(Laminated Body)

The heat-conducting sheet according to the present invention may be a single layer comprising an elastomer resin and a thermally conductive filler, or may be a laminated body in which resin layers each comprising an elastomer resin and a thermally conductive filler are laminated. From the viewpoint of providing the good heat-conductivity, a laminated body is preferable. Hereinafter, one example of the embodiment of a laminated body will be illustrated with reference to FIGS. 1 and 2.

Figure 2:
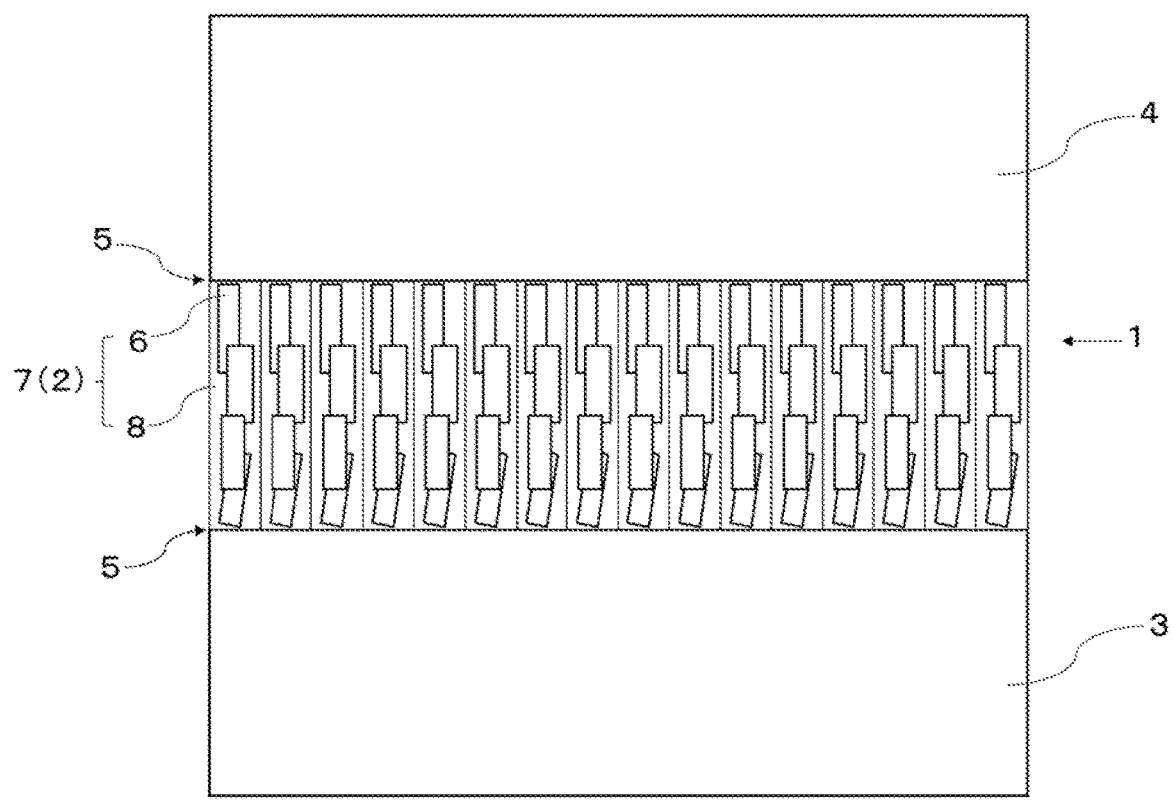
FIG. 2 is a schematic sectional view of a heat-conducting sheet composed of a laminated body in a use state.

In FIGS. 1 and 2, hatching for indicating a section of a resin is omitted in order to clarify the existence of a plate-like thermally conductive filler 6. In addition, each filler shown in respective figures overlaps with vertically adjacent fillers, but overlap of fillers is not essential in the present invention.

As illustrated in FIG. 1, a heat-conducting sheet 1 has a structure obtained by laminating a plurality of resin layers 2. A perpendicular plane to the lamination face of a plurality of resin layers 2 is a sheet plane 5. As illustrated in FIG. 2, the heat-conducting sheet 1 is disposed such that the sheet plane 5 are each in contact with a heating element 3 or a heat sink 4. In addition, the heat-conducting sheet 1 is disposed in a state where it is compressed between two members such as the heating element 3 and the heat sink 4. It is to be noted that the heating element 3 is, for example, a semiconductor package or the like, and the heat sink 4 is a metal or the like, such as, for example, aluminum or copper.

The thickness of the heat-conducting sheet 1 (namely, the distance between sheet plane 5 and sheet plane 5) is not particularly limited, and can be set in the range of, for example, 0.1 to 30 mm.

The thickness of one layer of the resin layers 2 (resin layer width) is not particularly limited, and can be preferably 1000 μm or less, more preferably 500 nm or less, and even more preferably 100 μm or less, and preferably 0.1 μm or more, more preferably 0.5 μm or more, and even more preferably 1 μm or more. By adjusting the thickness in such a manner, the heat-conductivity can be improved.

The resin layer 2 is a thermally conductive resin layer 7 comprising a thermally conductive filler 6. The thermally conductive resin layer 7 is the resin layer 2 having a structure obtained by dispersing a thermally conductive filler 6 having heat-conductivity in an elastomer resin 8.

The type of the thermally conductive filler is not particularly limited, but as illustrated in FIGS. 1 and 2, a plate-like filler is preferably used, in such a case, a major axis of the plate-like filler preferably has an angle of 45° or more, more preferably 50° or more, further more preferably 60° or more, even more preferably 70° or more, and even more preferably 80° or more relative to the sheet plane, and the major axis is preferably oriented to be approximately perpendicular to the sheet face. In a case where the plate-like filler has such orientation, the heat-conductivity of the heat-conducting sheet is improved. It is considered that this is probably because a heat-conducting path in a direction from the heating element to the heat sink is formed in the heat-conducting sheet.

The method for determining the angle is not particularly limited, and the angle can be determined in such a way that a thin film slice of a central part in a thickness direction in the thermally conductive resin layer 7 is prepared in a parallel direction to a direction to which the plate-like filler 6 is most oriented in the thermally conductive resin layer 7, the direction usually being a resin flowing direction at the time of molding, and the thin film slice is observed with a scanning electron microscope (SEM). In the scanning electron microscope (SEM) observation, the angle can be determined by observing the thermally conductive plate-like filler at 3000 magnifications to measure an angle formed between the major axis of the observed plate-like filler and a face constituting the sheet plane in the thermally conductive resin layer 7. In the present specification, the angle of 45° or more, 50° or more, 60° or more, 70° or more, or 80° or more means that the average value of the values measured as described above is equal to or more than the specific angle, and the existence of plate-like fillers 6 the orientation angle of which is less than 80° is not denied. It is to be noted that in a case where a formed angle exceeds 90°, the supplementary angle of the angle is regarded as the measured value.

The thickness of the thermally conductive resin layer 7 is preferably set to 1 to 1000 times, more preferably 1 to 500 times, further more preferably 1 to 50 times, even more preferably 1 to 10 times, even more preferably 1 to 3 times, and even more preferably 1 to 2 times the thickness of the thermally conductive plate-like filler 6 contained in the thermally conductive resin layer 7. By setting the width of the thermally conductive resin layer 7 to said range, the thermally conductive plate-like filler 6 can be oriented such that the major axis of the thermally conductive plate-like filler 6 has an angle of 80° or more relative to the sheet plane. It is to be noted that the width of the thermally conductive resin layer 7 does not have to be uniform as long as the width is within the range.

(Physical Properties of Heat-Conducting Sheet)

The initial Asker C hardness of the heat-conducting sheet according to the present invention is 50 or less. In the case when the initial Asker C hardness exceeds 50, the flexibility deteriorates, and the shape conformability to the heating element is reduced. It is to be noted that the initial Asker C hardness refers to a measured value of the hardness at the point in time when the measurement of the Asker C hardness of the heat-conducting sheet is started. The initial Asker C hardness of the heat-conducting sheet is preferably 45 or less, and more preferably 40 or less, and preferably 10 or more.

The Asker C hardness of the heat-conducting sheet according to the present invention after a lapse of 30 seconds is preferably 30 or less, and more preferably 20 or less. In addition, the Asker C hardness of the heat-conducting sheet after a lapse of 30 seconds is preferably half of the initial Asker C hardness or less. By setting the Asker C hardness to such values, the residual stress after applying a certain pressure to the heat-conducting sheet can be reduced, and damage of an electronic part or the like which is a heating element can be suppressed. It is to be noted that the Asker C hardness after a lapse of 30 seconds is the Asker C hardness at the point in time when 30 seconds have passed after starting the measurement of the Asker C hardness, and can be measured by the method described in Examples for further details. The Asker C hardness can be regulated by controlling the content of a filler such as the thermally conductive filler, the softness of the elastomer resin, and the affinity between the filling material and the elastomer resin.

From the viewpoint of heat dissipation properties of the sheet, the heat-conductivity of the heat-conducting sheet is preferably 5 W/m·K or more, more preferably 6 W/m·K or more, and even more preferably 7 W/m·K or more. In addition, the heat conductivity of the heat-conducting sheet is usually 100 W/m·K or less.

The gel fraction of the heat-conducting sheet is preferably 20% or less, more preferably 10% or less, further more preferably 5% or less, and even more preferably 0%. By lowering the gel fraction of the heat-conducting sheet, the Asker C hardness after a lapse of 30 seconds to the initial Asker C hardness (Asker C hardness after lapse of 30 seconds/initial Asker C hardness) can be lowered. The gel fraction can be measured by the method described in Examples. The gel fraction can be regulated by controlling, for example, the existence or not of crosslinking of the elastomer resin and the extent of crosslinking, as will be described later, and an uncrosslinked elastomer resin is preferably used because the gel fraction can be lowered.

From the viewpoint of achieving the good flexibility and the viewpoint of reducing the residual stress after compression, the 25% compressive strength of the heat-conducting sheet is preferably 200 kPa or less, and more preferably 190 kPa or less. From the same viewpoints, the 50% compressive strength of the heat-conducting sheet is preferably 1000 kPa or less, more preferably 800 kPa or less, and even more preferably 700 kPa or less.

[Method for Producing Heat-Conducting Sheet]

The method for producing the heat-conducting sheet according to the present invention is not particularly limited, but the heat-conducting sheet may be molded by supplying the thermally conductive filler, the elastomer resin, and, if necessary, an additive or additives into an extruder to perform melt-kneading, and extruding a melt-kneaded product in the form of a sheet from the extruder.

(Method for Producing Laminated Body)

The method for producing the heat-conducting sheet comprising a laminated body according to the present invention is not particularly limited, but the heat-conducting sheet can be produced using a process comprising a kneading step; a lamination step; and, if necessary, a slicing step, as described below.

<Kneading Step>

A thermally conductive resin composition is prepared by kneading the thermally conductive filler and the elastomer resin.

With respect to the kneading, for example, the thermally conductive filler and the elastomer resin are preferably kneaded using a twin screw kneader or a twin screw extruder, such as Plastomill, while being heated, and thereby the thermally conductive resin composition in which the thermally conductive filler is uniformly dispersed in the elastomer can be obtained.

Subsequently, by pressing the thermally conductive resin composition, a sheet-like resin layer (thermally conductive resin layer) can be obtained.

<Lamination Step>

In the lamination step, a laminated body having an n-layered structure is prepared by laminating the resin layer obtained in the kneading step. As a lamination method, for example, a method in which the resin layer prepared in the kneading step is $x_i$-divided, and divided resin layers are laminated to prepare a laminated body having an $x_i$-layered structure, thereafter, if necessary, hot pressing is performed, and further, if necessary, the divide, the lamination, and the hot pressing are thereafter repeated to prepare a laminated body having a width of D μm and having an n-layered structure can be used.

In a case where the thermally conductive filler is plate-like, the width (D μm) of the laminated body after the lamination step and the thickness (d μm) of the thermally conductive filler preferably satisfy $0.02 \leq d/(D/n) \leq 1$.

In a case where a multi-times of molding is performed for lamination in such a manner, the molding pressure in each time can be made smaller than that in a case where lamination is carried out by single-time molding, and therefore a phenomenon such as destruction of a laminated structure due to molding can be avoided.

As another lamination method, for example, a method in which an extruder provided with a multilayer formation block is used, and the multilayer formation block is adjusted, and thereby the laminated body having the n-layered structure and having the thickness of D μm is obtained through co-extrusion molding can also be used.

Specifically, the thermally conductive resin composition obtained in the kneading step is introduced to both of a first extruder and a second extruder, and the thermally conductive resin composition is extruded simultaneously from the first extruder and the second extruder. The thermally conductive resin composition extruded from the first extruder and from the second extruder are fed to a feed block. The thermally conductive resin composition extruded from the first extruder and from the second extruder join in the feed block. Thereby, a two-layered body in which the thermally conductive resin composition is laminated can be obtained. Next, the two-layered body is conveyed to the multilayer formation block to be divided into multiple parts along a plurality of faces each being parallel to the direction of extrusion and perpendicular to the lamination face, thereafter resultant two-layered bodies are laminated, and thus the laminated body having an n-layered structure and having a thickness of D μm can be prepared. In such a case, the thickness per layer (Din) can be made to be a desired value by adjusting the multilayer formation block.

(Slicing Step)

If necessary, the laminated body obtained in the lamination step is laminated in such a way as to have a desired height, bonded by applying pressure, and thereafter sliced in a direction parallel to the direction of lamination, and thus the heat-conducting sheet is prepared.

(Additional Step)

A step of crosslinking the elastomer resin may be provided between or together with the respective steps described above. Examples of crosslinking include a method of irradiation with ionizing radiation such as an electron beam, an α ray, a β ray, or a γ ray. However, when the degree of crosslinking of the elastomer resin is high, the residual stress after compressing the heat-conducting sheet becomes hard to reduce, and damage of an electronic component which is a heating element becomes liable to occur, and therefore the amount of irradiation of ionizing radiation is preferably limited to be 5 Mrad or less, and more preferably, the elastomer resin is not crosslinked.

EXAMPLES

The present invention will be illustrated in further detail with reference to Examples, but the scope of the present invention is by no means limited by these Examples.

Materials used in the following Examples and Comparative Examples are as follows.

(1) Elastomer Resin
(i) Liquid acrylonitrile butadiene rubber 1 manufactured by JSR Corporation, trade name "N231L"
(ii) Acrylonitrile butadiene rubber 2
Mixture of 7.2% by volume of the following (A) and 40.8% by volume of the following (B)
(A) Acrylonitrile butadiene rubber manufactured by JSR Corporation, trade name "N280"
(B) Liquid acrylonitrile butadiene rubber manufactured by JSR Corporation, trade name "N231L"
(iii) Acrylonitrile butadiene rubber 3
Mixture of 38% by volume of the following (A) and 10% by volume of the following (B)
(A) Acrylonitrile butadiene rubber manufactured by JSR Corporation, trade name "N280"
(B) Liquid acrylonitrile butadiene rubber manufactured by JSR Corporation, trade name "N231L"

(iv) Liquid isoprene rubber 1 manufactured by KURARAY CO., LTD., trade name "LIR-30"
(v) Liquid isoprene rubber 2 manufactured by KURARAY CO., LTD., trade name "KL-10"
(vi) Liquid silicone manufactured by Dow Corning Toray Co., Ltd., trade name "SE 1720CV"
(vii) Liquid EPDM (liquid ethylene-propylene-diene rubber) manufactured by Mitsui Chemicals, Inc., trade name "PX-068"
(viii) Acrylonitrile butadiene rubber 4
Mixture of 14.4% by volume of the following (A) and 33.6% by volume of the following (B)
(A) Acrylonitrile butadiene rubber manufactured by JSR Corporation, trade name "N280"
(B) Liquid acrylonitrile butadiene rubber manufactured by JSR Corporation, trade name "N231L"
(vx) Liquid isoprene rubber 3
Mixture of 14.4% by volume of liquid isoprene rubber 1 (manufactured by KURARAY CO., LTD., trade name "LIR-30") and 33.6% by volume of liquid isoprene rubber 2 (manufactured by KURARAY CO., LTD., trade name "KL-10"

(2) Thermally Conductive Filler
(i) Boron nitride manufactured by Denka Company Limited, trade name "SGP"
Shape; plate-like filler
Thermal conductivity in direction of longitudinal side; 250 W/m·K
Thickness: 1 μm
(ii) Graphene manufactured by Bridgestone KGB, Co., Ltd., trade name "WGNP"
Shape; plate-like filler
Thermal conductivity in direction of longitudinal side; 1000 W/m·K
Thickness; 2 μm Respective physical properties and evaluation methods are as follows.

<Viscosity>

The viscosity was measured using 50 g of an elastomer resin with a B type viscometer at 25° C. (manufactured by TOYO SANGYO CO., LTD.).

<Thermal Conductivity>

A 25-mm square heat-conducting sheet was interposed between a ceramic heater and a water cooling type heat dissipating plate and heated. The temperature T1 of the ceramic heater and the temperature T2 of the water cooling type heat dissipating plate were measured after a lapse of 20 minutes, and the electric power W applied to the ceramic heater, the thickness t of the heat-conducting sheet, and the area S of the heat-conducting sheet were substituted into the following equation to calculate the thermal conductivity λ.

$$\lambda = t \times W / \{S \times (T1 - T2)\}$$

<Asker C Hardness>

(Initial Asker C Hardness)

A 25-mm square heat-conducting sheet was laminated such that the thickness reached 10 mm or more, and the initial Asker C hardness was measured with an Asker rubber hardness meter C type (manufactured by Kobunshi Keiki Co., Ltd.).

(Asker C Hardness after Lapse of 30 Seconds)

The Asker C hardness at the point in time when 30 seconds had passed after starting the measurement of the Asker C hardness was measured.

Measurement of the Asker C hardness was conducted at 25° C.

<Compressive Strength>

The compressive strength was measured in accordance with JIS K6767-7.2.3 (JIS2009). However, measurement was conducted setting the sample size to 2 mm×20 mm×20 mm.

<Lamella Length>

An elastomer resin was put in a 100 φ container having a depth of 50 mm up to a height of 40 mm, a 60 φ ring was sunk to a depth of 2 mm from the elastomer resin interface, and the ring was lifted at a speed of 2 mm/s. The lamella length was calculated from the distance between a position where a formed film was broken when the ring was lifted and the interface. It is to be noted that measurement was conducted at a temperature of 25° C. and a relative humidity of 80%.

<Gel Fraction>

The gel fraction of a heat-conducting sheet was measured as follows.

A g of the heat-conducting sheet was weighed and immersed in xylene of 120° C. for 24 hours, insoluble matter was filtrated with 200-mesh wire netting, a residue on the wire netting was vacuum-dried to measure the weight (B g) of the dried residue, and the gel fraction was calculated according to the following equation from the weight (C g) of the filler in the heat-conducting sheet, the weight calculated from the weight of the heat-conducting sheet and the proportion of the filler formulated.

Gel fraction (% by weight)=((B−C)/A)×100

Example 1

A mixture consisting of 48% by volume of liquid acrylonitrile butadiene rubber 1 (manufactured by JSR Corporation, N231L) and 52% by volume of boron nitride was melt-kneaded and thereafter subjected to pressing to obtain a sheet-like resin layer having a thickness of 0.5 mm, a width of 80 mm, and a depth of 80 mm. Next, as a lamination step, the obtained resin layer was divided into 16 equal pieces, and the resultant pieces were stacked up to obtain a laminated body consisting of 16 layers and having a total thickness of 8 mm, a width of 20 mm, and a depth of 20 mm. Subsequently, the laminated body was sliced in parallel with the direction of lamination to obtain a heat-conducting sheet having a thickness of 2 mm, a width of 8 mm, and a depth of 20 mm. In this case, the thickness of one layer of the resin layers constituting the laminated body is 0.5 mm (500 μm). The thermal performance, the hardness, and the compressive strength of this heat-conducting sheet were measured from the direction of the section (direction of thickness).

Examples 2 to 8 and Comparative Examples 1 to 2

A resin sheet was obtained in the same manner as in Example 1 except that the formulation was changed as described in Table 1. Evaluation results are also shown in Table 1.

TABLE 1

| | | | Example | | | | | | | | Comparative Example | |
|---|---|---|---|---|---|---|---|---|---|---|---|---|
| | | | 1 | 2 | 3 | 4 | 5 | 6 | 7 | 8 | 1 | 2 |
| Composition | Elastomer [vol %] | Liquid acrylonitrile butadiene rubber 1 | 48 | | | | | 70 | | | | |
| | | Acrylonitrile butadiene rubber 2 | | | | | 48 | | | | | |
| | | Acrylonitrile butadiene rubber 3 | | | | | | | | | 48 | |
| | | Acrylonitrile butadiene rubber 4 | | | | | | | | 48 | | |
| | | Liquid isoprene rubber 1 | | 48 | | | | | | | | |
| | | Liquid isoprene rubber 2 | | | | | | | | | | 48 |
| | | Liquid isoprene rubber 3 | | | | | | | 48 | | | |
| | | Liquid silicone | | | 48 | | | | | | | |
| | | Liquid EPDM | | | | 48 | | | | | | |
| | Viscosity of elastomer [Pa · s] | | 850 | 130 | 140 | 74 | 1921 | 850 | 54 | 2954 | 6300 | 21 |
| | Lamella length of elastomer [mm] | | 55 | 40 | 42 | 32 | 64 | 55 | 23 | 69 | 82 | 16 |
| | Thermally conductive filler [vol %] | Boron nitride | 52 | 52 | 52 | 52 | 52 | | 52 | 52 | 52 | 52 |
| | | Graphene | | | | | | 30 | | | | |
| Performance | Thermal conductivity [W/m · K] | | 8.4 | 8.3 | 7.9 | 8.5 | 8.2 | 9.5 | 7.1 | 8.3 | 8.2 | 6.2 |
| | Asker C hardness (initial) | | 33 | 16 | 18 | 14 | 45 | 42 | 31 | 48 | 80 | 35 |
| | Asker C hardness (after lapse of 30 seconds) | | 16 | 7 | 7 | 6 | 22 | 20 | 15 | 23 | 65 | 33 |
| | 25% compressive strength [kPa] | | 181 | 111 | 121 | 108 | 181 | 176 | 202 | 195 | 451 | 251 |
| | 50% compressive strength [kPa] | | 549 | 380 | 391 | 365 | 621 | 615 | 966 | 664 | 2421 | 1412 |
| | Gel fraction [%] | | 1 | 0 | 1 | 1 | 0 | 1 | 0 | 1 | 1 | 0 |

It was found that in Examples 1 to 8, which are the heat-conducting sheets according to the present invention, the initial Asker C hardness is 50 or less, the flexibility is good, and the Asker C hardness after a lapse of 30 seconds is half of the initial Asker C hardness or less, and therefore the residual stress is reduced after applying pressure.

In contrast, it was found that in Comparative Example 1, which is an example where an elastomer resin having a value of viscosity higher than the value specified in the present invention was used, the initial Asker C hardness is high, and the flexibility is inferior. It was found that in Comparative Example 2, which is an example where an elastomer resin having a value of lamella length lower than the value specified in the present invention was used, the initial Asker C hardness is low, but the Asker C hardness after a lapse of 30 seconds is not changed so much from the initial level, and the residual stress is not reduced.

REFERENCE SIGNS LIST

1 Heat-conducting sheet
2 Resin layer
3 Heating element
4 Heat sink
5 Sheet plane
6 Thermally conductive plate-like filler
7 Thermally conductive resin layer
8 Elastomer resin

The invention claimed is:

1. A heat-conducting sheet comprising:
an elastomer resin at a volume proportion of 30 to 70%; and
a thermally conductive filler at a volume proportion of 30 to 70%,
the elastomer resin having a viscosity at 25° C. of 3000 Pa·s or less; and
the elastomer resin having a lamella length of 20 mm or more,
the heat-conducting sheet having an initial Asker C hardness of 50 or less, and
the heat-conducting sheet having a 25% compressive strength of 200 kPa or less.

2. The heat-conducting sheet according to claim 1, having a thermal conductivity of 5 W/m·K or more.

3. The heat-conducting sheet according to claim 1, wherein the Asker C hardness after a lapse of 30 seconds from the start of measurement is half of the initial Asker C hardness or less.

4. The heat-conducting sheet according to claim 1, having a 50% compressive strength of 1000 kPa or less.

5. The heat-conducting sheet according to claim 1, having a gel fraction of 20% or less.

6. The heat-conducting sheet according to claim 1, wherein the thermally conductive filler is at least one selected from the group consisting of aluminum oxide, magnesium oxide, boron nitride, talc, aluminum nitride, graphene, a boron nitride nanotube, a carbon nanotube, and diamond.

7. The heat-conducting sheet according to claim 1, wherein the thermally conductive filler has an average particle size of 200 μm or less and a thermal conductivity of 8 W/m·K or more.

8. The heat-conducting sheet according to claim 1, being a laminated body obtained by laminating resin layers each comprising the elastomer resin and the thermally conductive filler in a plane direction, wherein a thickness of one layer of the laminated resin layers is 1000 μm or less.

* * * * *